United States Patent [19]
Ahn et al.

[11] Patent Number: 5,499,218
[45] Date of Patent: Mar. 12, 1996

[54] METHOD FOR DRIVING BIT LINE SELECTING SIGNALS

[75] Inventors: Jin-Hong Ahn; Tae-Hyoung Kim; Sung-Ho Wang, all of Kyungki-do, Rep. of Korea

[73] Assignee: Goldstar Electron Co., Ltd., Chungcheongbuk-do, Rep. of Korea

[21] Appl. No.: 380,759

[22] Filed: Jan. 31, 1995

[51] Int. Cl.$^6$ ........................................ G11C 8/00
[52] U.S. Cl. ............... 365/230.06; 365/203; 365/189.11; 365/189.08; 365/230.03
[58] Field of Search ............... 365/230.06, 230.03, 365/189.11, 189.08, 203, 204

[56] References Cited

U.S. PATENT DOCUMENTS

| | | | |
|---|---|---|---|
| 5,280,448 | 1/1994 | Watanabe | 365/230.06 |
| 5,343,432 | 8/1994 | Matsuo et al. | 365/203 |
| 5,357,472 | 10/1994 | Shirota | 365/230.06 |
| 5,377,151 | 12/1994 | Komuro | 365/203 |

OTHER PUBLICATIONS

"Twisted Bit-Line Architectures for Multi-Megabit DRAM's", Hideto Hidaka et al., IEEE Journal of Solid State Circuits, vol. 24, No. 1, Feb. 1989.

*Primary Examiner*—Tan T. Nguyen

[57] ABSTRACT

A method for driving bit line selecting signals is disclosed, in which the DRAM cell includes a plurality of memory cell arrays, sense amplifiers, bit lines, bit line equalizer sections, bit line selecting sections, data input/output sections, and bit line selection signal generating sections. According to the present invention, the bit line selecting signals operate in such a manner that: during a bit line selection, a bit line selecting signal for connecting one pair of bit lines among the n pairs of bit lines to the sense amplifier is made to have a voltage level capable of connecting the bit lines to the sense amplifier by the help of the bit line selecting section without a voltage loss; the other bit line selecting signals corresponding to the non-selected remaining bit lines are given a voltage incapable of connecting the bit lines the sense amplifier by the bit line selecting section; thereafter, during the pre-charging for a bit line equalization, the bit line selecting signal corresponding to the bit line which was selected just before is given a voltage capable of connecting the bit lines to the sense amplifier by the help of the bit line selecting section; and the bit line selecting signals which do not correspond to the bit line selected just before are maintained without a voltage shifting.

6 Claims, 9 Drawing Sheets

FIG. 13

|            | BSSUM0 | SRSUM0 | N300 | BS0 | BSSUM1 | SRSUM1 | N301 | BS1 |
|------------|--------|--------|------|-----|--------|--------|------|-----|
| PRECHARGE  | 0      | 0      | 1    | VCC | 0      | 0      | 1    | VCC |
| BS0 SELECT | 0      | 0      | 0    | VPP | 1      | 1      | 1    | VSS |
| PRECHARGE  | 0      | 0      | 1    | VCC | 0      | 0      | 1    | VCC |
| BS1 SELECT | 1      | 1      | 1    | VSS | 0      | 0      | 0    | VPP |

FIG. 14

|            | BSSUM0 | SRSUM0 | N300 | BS0          | BSSUM1 | SRSUM1 | N301 | BS1          |
|------------|--------|--------|------|--------------|--------|--------|------|--------------|
| PRECHARGE  | X      | 0      | 0    | VCC OR VSS   | X      | 0      | 0    | VCC OR VSS   |
| BS0 SELECT | 0      | 1      | 1    | VPP          | 1      | 1      | 1    | VSS          |
| PRECHARGE  | X      | 0      | 0    | VCC          | X      | 0      | 0    | VSS          |
| BS1 SELECT | 1      | 1      | 1    | VSS          | 0      | 1      | 1    | VPP          |

FIG. 15

|            | BSSUM0 | SRSUM0 | N300 | BS0        | BSSUM1 | SRSUM1 | N301 | BS1        |
|------------|--------|--------|------|------------|--------|--------|------|------------|
| PRECHARGE  | 0      | 0      | 1    | VCC OR VSS | 0      | 0      | 1    | VCC OR VSS |
| BS0 SELECT | 0      | 0      | 0    | VPP        | 1      | 1      | 1    | VSS        |
| PRECHARGE  | 0      | 0      | 1    | VCC        | 0      | 0      | 1    | VSS        |
| BS1 SELECT | 1      | 1      | 1    | VSS        | 0      | 0      | 0    | VPP        |

METHOD FOR DRIVING BIT LINE SELECTING SIGNALS

FIELD OF THE INVENTION

The present invention relates to a method for driving DRAM cell bit line selecting signals, in which the power consumed for driving the bit line selecting signals is decreased, so that the method would be suitable for a low power consumption DRAM cell.

BACKGROUND OF THE INVENTION

Recently, in order to increase the density of DRAM cells, there is used a bidirectional shared sense amplifier in which two or more bit line pairs are connected to a single sense amplifier.

In this bidirectional shared sense amplifier, n (n indicates an integer having a value of two or more) bit line pairs are connected to a single sense amplifier, in such a manner that the bit lines can be connected and disconnected to and from the sense amplifier through bit line selecting switches.

In this structure, a plurality of bit lines shares a single sense amplifier, and therefore, the number of the sense amplifier is reduced, with the result that the area of the chip is reduced.

FIG. 1 is a block diagram showing the constitution of such a bidirectional shared sense amplifier.

A DRAM cell array 10-1 includes a plurality of bit lines connected to a plurality of cells, and the bit lines (for example BL and /BL) are connected through a bit line equalizer section 11-1 and a bit line selecting switch section 12-1 to a sense amplifier 13.

On the other side of the sense amplifier 13, there are also connected bit lines (which are connected to a plurality of cells of a DRAM cell array 10-2) through a bit line equalizer section 11-2 and a bit line selecting switch section 12-2.

Further, a data input/output section 14 is connected to the sense amplifier 13, so that the data read by the sense amplifier would be transmitted to a data bus.

The bit line selecting switch receives bit line selecting signals BS0 and BS1 which are generated by a bit line selection signal generating section 15.

The first bit line selecting switch section 12-1 receives a bit line selecting signal BS0 from the bit line selection signal generating section 15, while the second bit line selecting switch section 12-2 receives a bit line selecting signal BS1 from the bit line selection signal generating section 15.

The bit line equalizer section receives bit line equalizing signals, and the first bit line equalizer section receives a bit line equalizing signal BLEQ0, while the second bit line equalizer 11-2 receives a bit line equalizing signal BLEQ1.

The bit line selecting signals BS0 and BS1 perform the function of selecting the respective bit lines, and the sense amplifier 13 senses the potential difference between the bit lines to amplify the difference. The bit line equalizer section performs the function of equalizing and releasing the bit lines. That is, before selecting the word line, the equalization of the bit lines is released by means of BLEQ0 and BLEQ1.

The data input/output section 14 serves as a path when reading or writing data.

The bit line selection signal generating section 15 controls the respective bit line selecting signals during a power up, during a bit line selection, and during a pre-charging.

FIG. 2 illustrates wave patterns showing the operation examples of the conventional bit line selecting circuit. In this drawing, an example is taken in which the signals BS0 and BS1 are selected by once respectively, and the illustration is made for the two cases of a bit line selection and a pre-charging.

During the time of pre-charging, all the signals are maintained at a Vcc level regardless of the preceding state of the bit line selecting signal.

Then during the selection of a bit line, the case of selecting the signal BS0 will be taken as an example. The selected signal BS0 is stepped up from the Vcc level to a Vpp level, and the bit line which corresponds to it is connected to the sense amplifier. The Vpp voltage is higher than the Vcc voltage as much as Vth of the switching transistor.

Meanwhile, the signal BS1 has not been selected, and therefore, it is shifted from Vcc to Vss.

Meanwhile, during the pre-charging, the signals BS0 and BS1 all have the Vcc level. This is due to the fact that, in order to equalize the bit lines, the potentials of the equalized bit lines have to be transmitted to the sense amplifier.

In this way, during the selection of a bit line, the signals corresponding to the selected bit lines are shifted to the Vpp level, while the rest of them are maintained at the Vss level. On the other hand, during the pre-charging, all the signals have the vcc level, thereby equalizing the sense amplifier.

During the selection, the equalizer signals BLEQ are shifted to a low level by the bit line equalizer section after being slightly delayed behind the signal /RAS. Thus the bit lines BL and /BL are stopped from being equalized, so that the bit lines would be isolated from a pre-charging voltage VBL.

Under this condition, the bit line selecting signal comes to have the Vpp level which is higher than Vcc+Vth, so that the bit line selecting switch consisting of an NMOS transistor TR would be able to connect the bit line to the sense amplifier without voltage loss.

Thereafter, if a word line to be selected is shifted to a high level by receiving a row address, then the charge of the cell which is connected to one of the bit lines BL and/BL is charge-distributed so as to have a slight high or slightly low voltage.

Under this condition, an enable signal is supplied to the sense amplifier, so that the voltage difference between the bit lines would be spread to Vcc and Vss. Ultimately, the data which is stored in the cell is transmitted to the bit line to be sent through the sense amplifier to the input/output line.

FIG. 3 is a block diagram showing the constitution of a double shared sense amplifier in which four pairs of bit lines are connected to a single sense amplifier.

In this structure, the number of the bit lines is twice, compared with that of FIG. 1.

DRAM cell arrays 20-1 and 20-2 include a plurality of bit lines which are connected to a plurality of cells. These bit lines (e.g., BL and /BL) are connected through a bit line equalizer section 21-1 and a bit line selecting switch sections 22-1 and 22-2 to a sense amplifier 23.

On the other side of the sense amplifier 23, there are connected bit lines which are connected to a plurality of cells of other DRAM cell arrays 20-3 and 20-4, the bit lines being connected through a bit line equalizer section 21-2 and bit line selection switch sections 22-3 and 22-4.

Further, a data input/output section 24 is connected to the sense amplifier 23, so that the data read out by the sense amplifier 23 can be transmitted to a data bus.

The bit line selecting switch receives bit line selecting signals BSU0, BSU1, BSD0 and BSD1 which are generated by a bit line selection signal generating section 25.

In this case, the signals BSU0, BSU1, BSD0 and BSD1 plays the role of selecting the bit lines, while signals BLEQU1, BLEQU0, BLEQD0 and BLEQD1 plays the roles of equalizing and releasing the bit lines.

An upper first bit line selecting switch section 22-1 receives bit line selecting signals BSU0 which are generated by the bit line selection signal generating section 25. A lower first bit line selecting switch section 22-2 receives bit line selecting signals BSU1, and an upper second bit line selecting switch section 22-3 receives bit line selecting signals BSD0, while a lower second bit line selecting switch section 22-4 receives bit line selecting signals BSD1.

Meanwhile, the bit line equalizer section receives bit line equalizing signals. A first bit line equalizer section 21-1 receives the bit line equalizing signals BLEQU0 for equalizing the bit lines which are connected to the upper first bit line selecting switch section. The first bit line equalizer section 21-1 also receives the bit line equalizing signals BLEQU1 for equalizing the bit lines which are connected to the lower first bit line selecting switch section.

The second bit line equalizer section 21-2 receives the bit line equalizing signals BLEQD0 for equalizing the bit lines which are connected to the second bit line selecting switch section. The second bit line equalizer section 21-2 also receives the bit line equalizing signals BLEQD1 for equalizing the bit lines which are connected to the lower bit line selecting switch section.

The bit line selecting signals, the sense amplifier 23, the bit line selection signal generating section 25 and the data input/output section 24 play the same roles as those of FIG. 1.

In this example like that of FIG. 2, the selection of the signals BSU0 and BSU1 respectively by once will be described.

First, during a pre-charging, the two signals all are maintained at the Vcc level regardless of the state of the preceding bit line selecting signal.

Then, during the selection of the bit line, in the case where the signal BSU0 is selected, the selected signal BSU0 is shifted from the Vcc to the Vpp so as to connect the relevant bit line to the sense amplifier. On the other hand, if the signal BSU1 has not been selected, it is shifted from the Vcc to the Vss.

During the next pre-charging, the signals BSU0 and BSU1 all are maintained at the Vcc level.

Thus, during the selection of bit lines, the signals corresponding to the selected bit lines are shifted to the Vpp level, and the rest of the signals are maintained at the Vss level. On the other hand, during the pre-charging, all the signals are maintained at the Vcc level so as to equalize the sense amplifier. The other operations are same as those of the example of FIG. 1.

FIG. 4 illustrates a conventional bit line selection signal generating circuit (15 and 25), and FIG. 5 illustrates a bit line selection signal generating section having two bit line selection signal generating circuits (15 and 25).

As shown in FIG. 4, the conventional bit line selection signal generating circuit (called BSG) for generating the signal BS0 is constituted such that a parallel circuit consisting of two NMOS transistors MN2 and MN3 is connected to a serial circuit consisting of one NMOS transistor MN1 and two PMOS transistors MP1 and MP2 connected to the Vcc level, the parallel circuit being connected to the Vss level. Further, a PMOS transistor MP3 which is connected to the Vpp source is connected to the connecting point between the transistors MN1 and MN2.

In order to generate bit line signals BS#, the gates of the PMOS transistor MP1 and the NMOS transistor MN2 are connected to a signal BSSUM#, and the gates of the PMOS transistor MP2 and the NMOS transistor MN3 are connected to a signal SRSUM#, while the gates of the NMOS transistor MN1 and the PMOS transistor MP3 are connected to n300. The output signal BS# is connected to the connection point between the transistors MP3 and MN3.

In order for the BSG to generate bit line signals BS0, the gates of the PMOS transistor MP1 and the NMOS transistor MN2 are connected to a signal BSSUM0, and the gates of the PMOS transistor MP2 and the NMOS transistor MN4 are connected to a signal SRSUM0, while the gates of the NMOS transistor MN1 and the PMOS transistor MP3 are connected to n300. The output signal BS0 is connected to the connection point between the transistor MP3 and the transistor MN3. The bit line signal generating section is called BSG0, and its operation is as shown in Table 1.

During the pre-charging, the signals BSSUM0 and BRSUM0 have a value of "0", and n300 has a value of "1", so that the circuit output BS0 would have the Vcc level. "1" indicates a high level, and "0" indicates a low level. During the pre-charging, when the signals BSSUM0 and BRSUM0 are "0" and n300 is "1", the transistors MP1, MP2 and MN1 are turned on, and the transistors MP3, MN2 and MN3 are turned off, with the result that the output BS0 of this circuit comes to have the Vcc level.

When the BS0 is selected, the signals BSSUM0 and BRSUM0 becomes "0", and n300 also becomes "0", with the result that the transistor MP3 is turned on, and that the transistor MN1 is turned off. Consequently, the output BS0 of this circuit comes to have the Vpp level.

When the pre-charging is carried out at the next time, the signals BSSUM0 and BRSUM0 becomes "0", and n300 becomes "1", with the result that the output BS0 of this circuit becomes the Vss level.

Then the constitution of the bit line selection signal generating circuit BSG1 which is for generating a signal BS1 is same as that of the circuit BSG0, except that the input signal is connected to BSSUM1 instead of BSSUM0, to BRSUM1 instead of BRSUM0, and to n301 instead of n300. The output signal BS1 is connected to the connection point between the transistors MP3 and MN3.

The operation of the bit line selection signal generating section thus connected is as shown in the right portion of Table 1.

That is, during the pre-charging, the signals BSSUM1 and BRSUM1 become "0", and n300 becomes "1", with the result that the output BS1 of this circuit has the Vcc level.

When the BS0 is selected, the signals BSSUM1 and BRSUM1 becomes "1", and n301 also becomes "1", with the result that the output BS1 of this circuit has the Vss level.

When the pre-charging is carried out again next time, the signals BSSUM1 and BRSUM1 becomes "0" and n301 becomes "1" with the result that the output BS1 of this circuit has the Vcc level.

When the BS1 is selected next time, the signals BSSUM1 and BRSUM1 becomes "0", and n301 also becomes "0", with the result that the output BS1 of this circuit has the Vpp level.

The bit line selection signal generating section 25 of FIG. 3 includes four bit line selection signal generating circuits of FIG. 4, and these four circuits receive respectively different input signals.

When the output signals BSU0, BSU1, BSD0 and BSD1 are selected, only these signals are shifted to the Vpp level, while during the pre-charging, they come to have the Vcc level. Meanwhile, when other signals are selected, they come to have the Vss level.

In the conventional technique described above, during both the power up and the pre-charging, all the selected signals are maintained at the Vcc level. Therefore, as can be seen in FIG. 2, in accordance with the selections of the respective bit lines, signal transitions in the form of Vcc→Vss and Vss→Vcc occur many times, with the result that the power consumption is increased. Consequently, it is unsuitable for forming a low power consumption DRAM.

SUMMARY OF THE INVENTION

The present invention is intended to overcome the above described disadvantages of the conventional techniques.

Therefore it is the object of the present invention to provide a method for driving bit line selecting signals, in which the constitutions of the sense amplifier and the bit line of the DRAM cell are same as those of the conventional technique, and the constitution of the bit line selection signal generating circuit is different from that of the conventional technique, in driving the bit line, so that the power consumption would be reduced.

In achieving the above object, the method according to the present invention is characterized in that:

there are involved a plurality of memory cell arrays, sense amplifiers, bit lines, bit line equalizer sections, bit line selecting sections, data input/output sections, and bit line selection signal generating sections;

a single sense amplifier is connected to n (n being an integer such as 2, 4 or the like) bit line pairs, the bit lines connected to the sense amplifier pass through a bit line selecting section, and the bit line passed through the bit line selecting section is connected through a bit line equalizer section to a cell array; and the bit line equalizer section performs the functions of equalizing and releasing the bit lines, the bit line selecting section performs the function of connecting and disconnecting the bit line to and from the sense amplifier, the sense amplifier augments the voltage difference between the selected bit lines, the data input/output section plays the role of outputting the augmented voltage of the bit line to the outside and storing external data into the cell by receiving the data through the bit line, and the bit line selection signal generating section sends bit line selecting signals to the bit line selecting section for making the sense amplifier and the bit line connected together.

According to the present invention, the bit line selecting signals operate in such a manner that: during a bit line selection, a bit line selecting signal for connecting one pair of bit lines among the n pairs of bit lines to the sense amplifier is made to have a voltage level capable of connecting the bit line to the sense amplifier by the help of the bit line selecting section without a voltage loss; the other bit line selecting signals corresponding to the non-selected remaining bit lines are given a voltage incapable of connecting the bit lines to the sense amplifier by the bit line selecting section; thereafter, during the pre-charging for a bit line equalization, the bit line selecting signal corresponding to the bit line which was selected just before is given a voltage capable of connecting the bit line to the sense amplifier by the help of the bit line selecting section; and the bit line selecting signals which do not correspond to the bit line selected just before are maintained without voltage shifting.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 6:
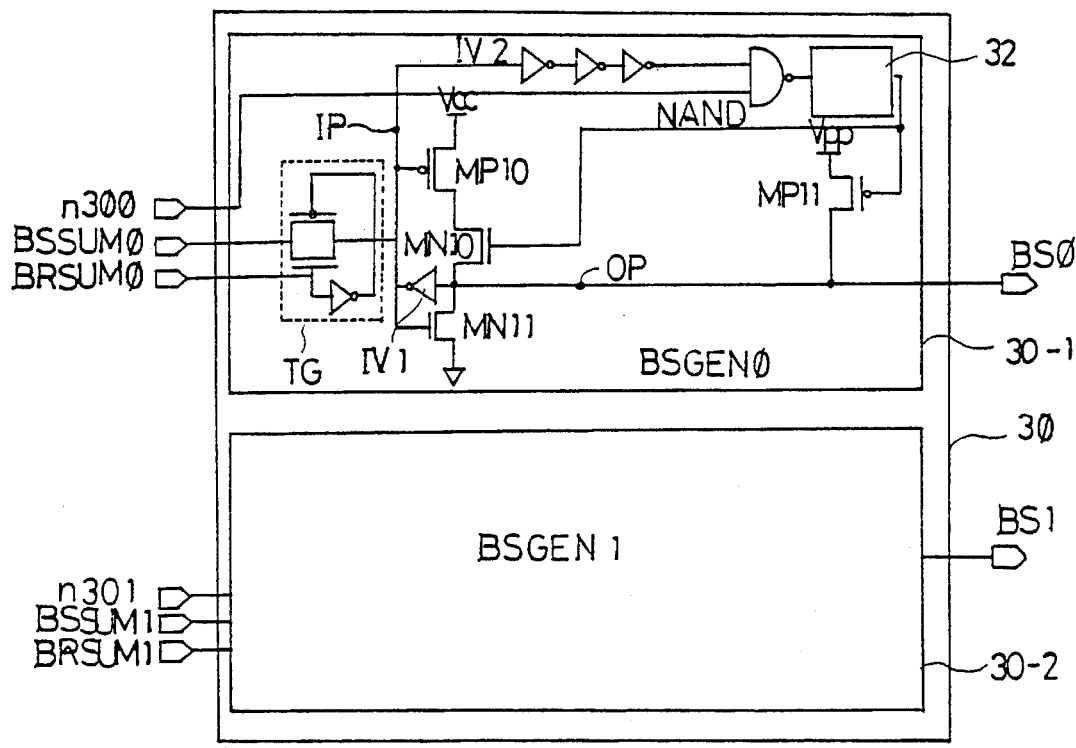
FIG. 6 is a circuital illustration of a first embodiment of the bit line selection signal generating circuit according to the present invention.
Figure 7:
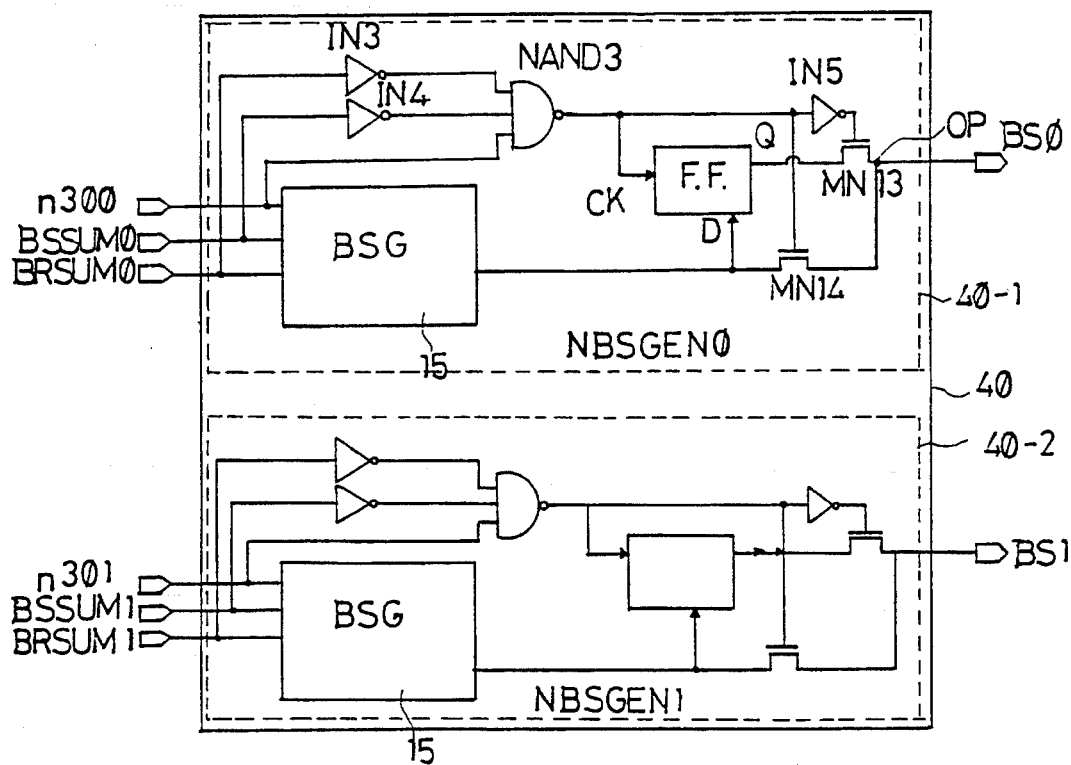
FIG. 7 is a circuital illustration of a second embodiment of the bit line selection signal generating circuit according to the present invention.

FIG. 6 is a circuital illustration of a first embodiment of the bit line selection signal generating circuits (15 and 25) according to the present invention. FIG. 7 is a circuital illustration of a second embodiment of the bit line selection signal generating circuits (15 and 25) according to the present invention.

Referring to FIG. 6, a bit line selection signal generating circuit BSGEN# for generating signals BS# is constituted such that two NMOS transistors MN10 and MN11 are serially connected to a PMOS transistor MP10 between a Vcc terminal and a Vss terminal.

Further, a PMOS transistor MP11 which is connected to the Vpp terminal is connected to the connection point (an output node OP) between the transistors MN10 and MN11.

Further, a connection is made from the output node OP through an invertor IV1 to an input node IP. Further, a connection is made from the input node IP through an invertor IV2 to an input terminal of a NAND gate.

Further, the gates of the PMOS transistor MP10 and the NMOS transistor MN11 are connected to the input node IP, and a connection is made from the input node IP through a transmission gate TG to a signal BSSUM#. Further, a signal SRSUM# is connected to a control input terminal of the transmission gate TG, and a signal n300 is connected to another input terminal of the NAND gate.

The output of the NAND gate is connected to a level shift circuit 32 which shifts the Vcc level to the Vpp level. The output of the level shift circuit 32 is connected to the gates of the transistors MP11 and MN10.

As can be seen in FIG. 6, the bit line selection signal generating circuit BSGEN0 is constituted such that a serial circuit consisting of two NMOS transistors MN10 and MN11 and the PMOS transistor MP10 is connected between the Vcc terminal and the Vss terminal. Further, the PMOS transistor MP11 which is connected to the Vpp terminal is connected to the connecting point (the output node OP) between the transistors MN10 and MN11.

A connection is made from the output node OP through the invertor IV1 to the input node IP, and a connection is made from the input node IP through the invertor IV2 to an input terminal of the NAND gate.

The gates of the PMOS transistor MP10 and the NMOS transistor MN11 are connected to the input node IP, and a connection is made from the input node IP through the transmission gate TG to the signal BSSUM0. The signal SRSUM0 is connected to a control input terminal of the transmission gate TG, and the signal n300 is connected to another input terminal of the NAND gate.

The output of the NAND gate is connected to the level shift circuit 32 which shifts the Vcc level to the Vpp level. The output of the level shift circuit 32 is connected to the gates of the transistors MP11 and MN10.

There is provided another bit line selection signal generating circuit BSGEN1 which is just same as the bit line selection signal generating circuit BSGEN0, except that the input signal terminals are respectively connected to different signal terminals, i.e., to BSSUM1 instead of BSSUM0, and to BRSUM1 instead of SRSUM0, and to n301 instead of n300. The bit line selection signal generating circuits BSGEN0 and BSGEN1 are combined together to form a bit line selection signal generating section 30.

The operation of the bit line selection signal generating circuit BSGEN0 is done as shown in the left portion of Table 2.

During the pre-charging, the operation of the bit line selection signal generating circuit BSGEN0 for generating the signal BS0 is not related to the status of the BSSUM0, while the BRSUM0 and n300 are all become "0", so that the output BS0 of the BSGEN0 would have the Vcc or Vss level.

That is, during the pre-charging, if the BRSUM0 is "0", then the transmission gate TG is turned off, so that the status of the BSSUM0 would become of no account. If the n300 becomes "0", the output of the NAND gate is shifted to a high level, so that the transistor MP11 would be turned off, and the transistor MN10 would be turned on. If the preceding status of the OP was high, the IP becomes low by the invertor IV1, so that the transistor MP10 would be turned on, that the transistor MN11 would be turned off, and that the OP would have the Vcc level. On the other hand, if the OP was low, then the IP is high, and therefore, even if the transistor MN10 is turned on, the transistor MP10 is turned off, and the transistor MN11 is turned on. Consequently, the OP comes to have the Vss level.

When the BS0 is selected, the BSSUM0 becomes "0", and the BRSUM0 and n300 become "1" so that the output BS0 of this circuit would have the Vpp level. That is, under this condition, if the BRSUM0 is "1", then the transmission gate TG is turned on, and therefore, the IP is determined in accordance with the status of the BSSUM0, so that the output would become high. If the n300 is "1", the output of the NAND gate becomes low so as to turn on the transistor MP11 and to turn off the transistor MN10, with the result that the status of the OP comes to have the Vpp level.

When the pre-charging is carried out again later, the BRSUM0 and the n300 become "0" regardless of the BSSUM0, with the result that the output BS0 of this circuit comes to have the Vcc level. The reason is that the IP is in the low level.

Then during the selection of BS1, the BSSUM0, BRSUM0 and n300 all become "1", with the result that the output of this circuit comes to have the Vss level.

When the pre-charging is carried out after the selection of the BS1, the BRSUM0 and n300 become "0" regardless of the BSSUM0, so that the output BS0 of the circuit would come to have the Vss level.

The operation of the bit line selection signal generating circuit BSGEN1 for generating the signal BS1 is as shown in the right portion of Table 2.

During the pre-charging, the BRSUM1 and n301 all become "0" regardless of the status of the BSSUM1, with the result that the output BS1 of the BSGEN1 comes to have the Vcc or Vss level.

When the BS0 is selected, the BSSUM1, BRSUM1 and n301 all become "1" with the result that the output BS1 of the circuit comes to have the Vss level.

When the pre-charging is carried out later again, the BRSUM1 and n301 become "0", with the result that the output BS1 of the circuit comes to have the Vss level.

When the BS1 is selected later, the BSSUM1 becomes "0", and the BRSUM1 and n301 become "1" regardless of the BSSUM1, with the result that the output BS1 of the circuit comes to have the Vpp level.

When the pre-charging is carried out later again, the BRSUM1 and n301 all become "0" regardless of the BSSUM1, with the result that the output BS1 of the circuit comes to have the Vcc level.

When the BS1 is selected later, the BSSUM1 becomes "0", and the BRSUM1 and n301 all becomes "1", with the result that the output BS1 of the circuit comes to have the Vpp level.

Therefore, if a signal state forming a pre-charging signal state is brought out, that is, if the preceding state of the output BS1 is the Vpp state with the BRSUM1 and n301 being "0" regardless of the BSSUM1, then the BS1 comes to have the Vcc level. On the other hand, if the preceding state of the output BS1 is the Vss state, then the BS1 comes to have the Vss level.

This operation is same in the BSGEN0.

FIG. 7 is a circuital illustration of a second embodiment of the bit line selection signal generating circuits (15 and 25) according to the present invention.

As shown in FIG. 7, the bit line selection signal generating circuit NBSGEN0 for generating the signal BS0 uses a flip-flop structure on the conventional BSG circuit, so that the bit line selecting signal selected previously can be used during the next pre-charging. Here, a level shifter is used to level-up the Vcc level to the Vpp level.

In this circuit, two input terminals of a NAND3 gate having three input terminals are connected respectively through invertors IN3 and IN4 to the BRSUM0 and BSSUM0, while the remaining input terminal is connected to the n300 terminal.

The output of the NAND3 gate is inputted into a CK terminal as a control signal for the flip-flop FF, and the output of the NAND3 gate is also supplied through an invertor IN5 to the gate of a transistor MN13.

An input terminal D of the flip-flop FF is connected to the output terminal of the conventional bit line selection signal generating circuit BSG, while an output terminal Q of the flip-flop FF is connected through an NMOS transistor MN13 to its output terminal in the form of BS0. Further another connection is made from the output terminal of the bit line selection signal generating circuit BSG through an NMOS transistor MN14 to its output terminal in the form of BS0. Further, the gate of the transistor MN14 is connected to the output terminal of the NAND3 gate.

Further, there is provided another bit line selection signal generating circuit BSGEN1 which is same as the bit line selection signal generating circuit BSGEN0, except that its input terminals are respectively connected to different signals, i.e., to BSSUM1 instead of BSSUM0, to BRSUM1 instead of SRSUM0, and to n301 instead of n300. This bit line selection signal generating circuit BSGEN1 is combined with the bit line selection signal generating circuit BSGEN0 so as to form a bit line selection signal generating section 40.

The operation of the bit line selection signal generating circuit NBSGEN0 is shown in the left portion of Table 3.

The bit line selection signal generating circuit NBSGEN0 for generating the signals BS0 will be described as to its operations.

During the pre-charging, the BSSUM0 and BRSUM0 become "0", and n300 becomes "1", so that the output BS0 of the bit line selection signal generating circuit NBSGEN0 would come to have the Vcc level or the Vss level.

When the BS0 is selected, the BSSUM0, BRSUM0 and n300 all become "0" and therefore, the output BS0 of the circuit comes to have the Vpp level.

When the pre-charging is carried out later again, the BSSUM0 and BRSUM0 become "0", and n300 becomes "1", with the result that the output BS0 of the circuit comes to have the Vcc level.

Then when the BS1 is selected, the BSSUM0, BRSUM0 and n300 all become "1" and therefore, the output BS0 of the circuit comes to have the Vss level.

When the pre-charging is carried out again after the selection of the BS1, the BSSUM0 and BRSUM0 become "0", and the n300 becomes "1", with the result that the output BS0 of this circuit comes to have the Vss level.

The operation of the bit line selection signal generating circuit NBSGEN1 for generating the signal BS1 is as shown in the right portion of Table 2.

During the pre-charging, the BSSUM0 and BRSUM0 become "0", and the n300 becomes "1" so that the output BS1 of the circuit NBSGEN1 would come to have the Vcc level or the Vss level.

When the BS0 is selected, the BSSUM0, BRSUM0 and n300 all become "1" and therefore, the output BS1 of this circuit comes to have the Vss level.

When the pre-charging is carried out later again, the BSSUM0 and BRSUM0 become "0", and the n300 becomes "1", with the result that the output BS1 of the circuit comes to have the Vss level.

Then when the BS1 is selected, the BSSUM0, BRSUM0 and n300 all become "0", and therefore, the output BS1 of this circuit comes to have the Vpp level.

When the pre-charging is carried out again after the selection of the BS1, the BSSUM0 and BRSUM0 become "0", and the n300 becomes "1", with the result that the output BS0 of this circuit comes to have the Vcc level.

Therefore, even under the signal state in which the same pre-charging signal state is formed, that is, even under the condition that the BSSUM1 and BRSUM1 become "0" and n301 becomes "1" the output BS1 comes to have the Vcc level, if the preceding state of the output BS1 is the Vpp state. On the other hand, if the preceding state of the output BS1 is the Vss state, the output BS1 comes to have the Vss level.

The same operation pattern is seen in the bit line selection signal generating circuit NBSGEN0.

Figure 1:
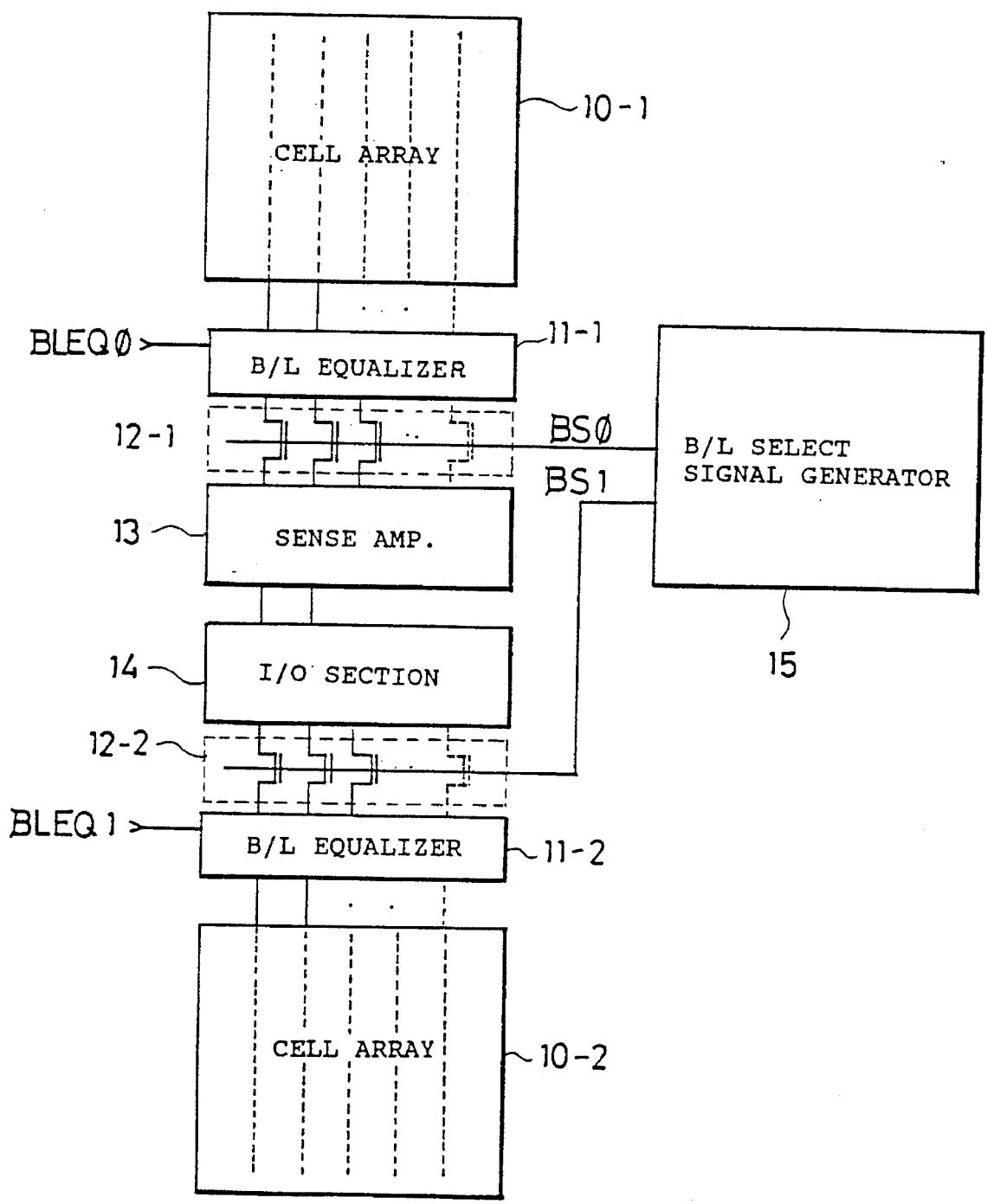
FIG. 1 is a block diagram showing an example of a bidirectional shared sense amplifier.
Figure 2:
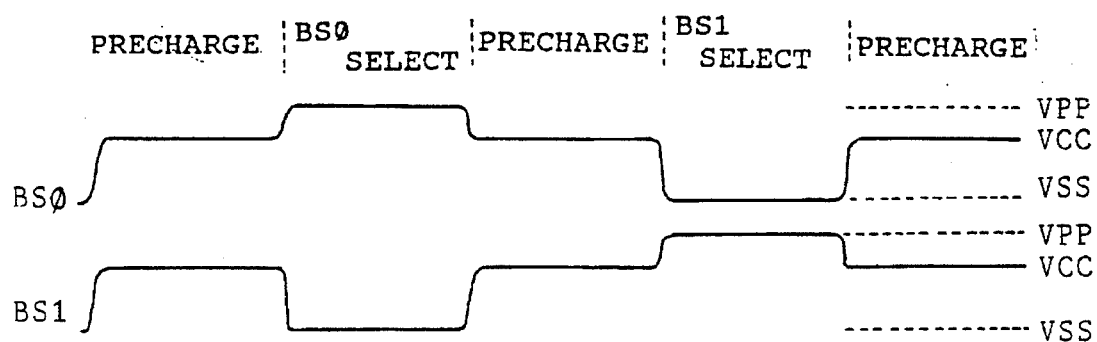
FIG. 2 illustrates wave patterns for the operation of the conventional bit line selecting circuit.
Figure 8:
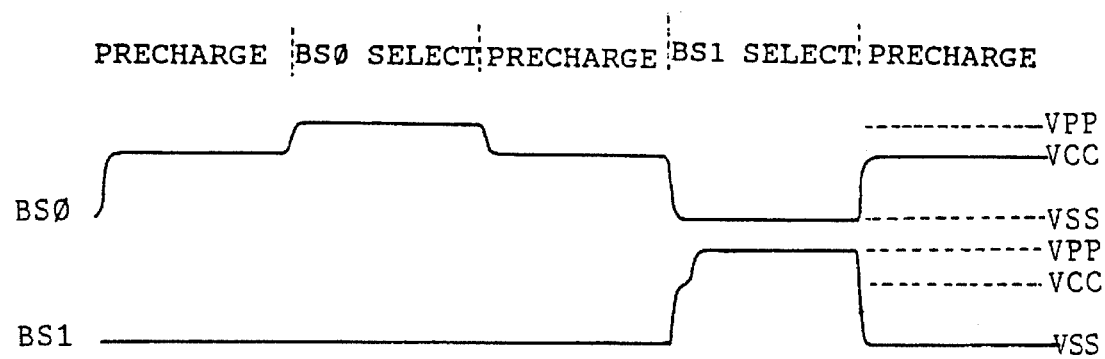
FIG. 8 illustrates wave patterns for an example of a proposed bit line selecting method.

FIG. 8 illustrates an example of the proposed bit line selecting method. This method is proposed for reducing the power consumption during the signal transition of the bit line selecting signal. The method can be described by dividing it into a bit line selection and a pre-charging. First, during the pre-charging, only one signal which has been defined in advance is maintained at the Vcc level, unlike the conventional technique in which all the signals are maintained at the Vcc level.

For the bit line selection, the case where the BS0 is selected will be taken as an example. The BS0 is shifted up from the Vcc level to the Vpp level to select the bit line, while the BS1 is not selected. Therefore the BS1 is maintained at the Vss level.

Thereafter, during the pre-charging, the signal BS0 is maintained at the Vcc level after being shifted from the Vpp level, and equalizes the bit lines. Under this condition, the signal BS1 is maintained at the Vss level.

Thereafter, if the signal BS1 is selected, the signal BS1 is shifted from the Vss level to the Vcc level, and shifted again from the Vcc level to the Vpp level. On the other hand, the signal BS0 which is not selected is shifted down to the Vss level.

In this method, during the selection of the signal BS0, the power consumption caused by the signal transition can be saved, but there is the disadvantage that, during the selection of the signal BS1, the power consumption is more increased compared with the conventional technique.

Figure 9:
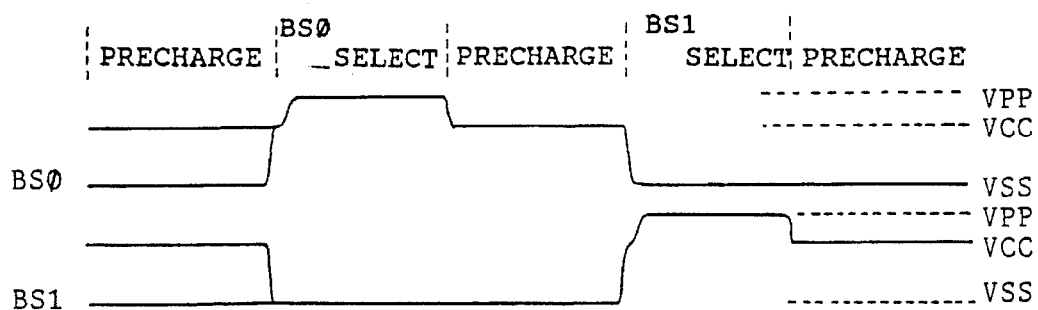
FIG. 9 illustrates wave patterns for an example of the bit line selecting method according to the present invention.

Therefore, in order to overcome this disadvantage, the present invention provides the bit line selecting method of FIG. 9.

FIG. 9 illustrates an example of the bit line selecting method according to the present invention. This method is same as that of FIG. 8 in that, during the pre-charging, only one bit line selecting signal has the Vcc level. However, in FIG. 8, during the pre-charging, the signal lying at the Vcc level is fixed, while, in the present method, the signal which has been selected in the preceding state is maintained at the Vcc level during the pre-charging. Therefore, no matter which bit line selecting signal is selected, the number of the signal transitions in the form of $Vcc \leq - \geq Vss$ is reduced, thereby decreasing the power consumption.

This will be described by dividing it into the pre-charging and the bit line selection. During the pre-charging, the signal which has been selected at the preceding state is maintained at the Vcc level, while the rest of the signals are maintained at the Vss level.

Thereafter, during the bit line selection, the selected signal is shifted up to the Vpp level, while the rest of the signals are maintained at the Vss level.

Figure 10:
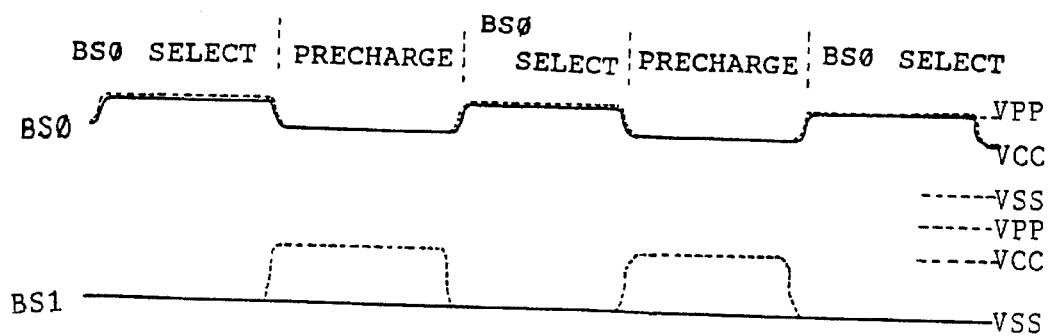
FIG. 10 illustrates wave patterns showing the effect of the present invention and that of the conventional technique when the bit line selecting signals select bit lines continuously.

FIG. 10 illustrates a comparison of the present invention with the conventional technique for the case where the bit line selecting signals are continuously selected. In the conventional technique which is shown by the dotted lines, both of the signals are maintained at the Vcc level during the pre-charging, with the result that the power consumption caused by the signal transitions is very high. On the other hand, in the present invention which is shown by the solid lines, the signals which are not selected are maintained at the Vss level, and therefore, the power consumption caused by the signal transitions is decreased.

During the pre-charging in the conventional technique, all the bit line selecting signals are maintained at the Vcc level, and therefore, during the bit line selection, signal transitions occur, so that the power consumption would be increased. On the other hand, according to the present invention, only one bit line selecting switch is maintained at the Vcc level during the pre-charging. Therefore, the number of the signal transitions is reduced, so that the power consumption would be decreased, thereby realizing a low power consumption DRAM cell.

Particularly, during the self refresh operation in which a low power consumption is required, the word lines are activated in an orderly manner, and therefore, there is the possibility that the same sense amplifier may be repeatedly selected. For this case, the present method is very effective.

Figure 11:
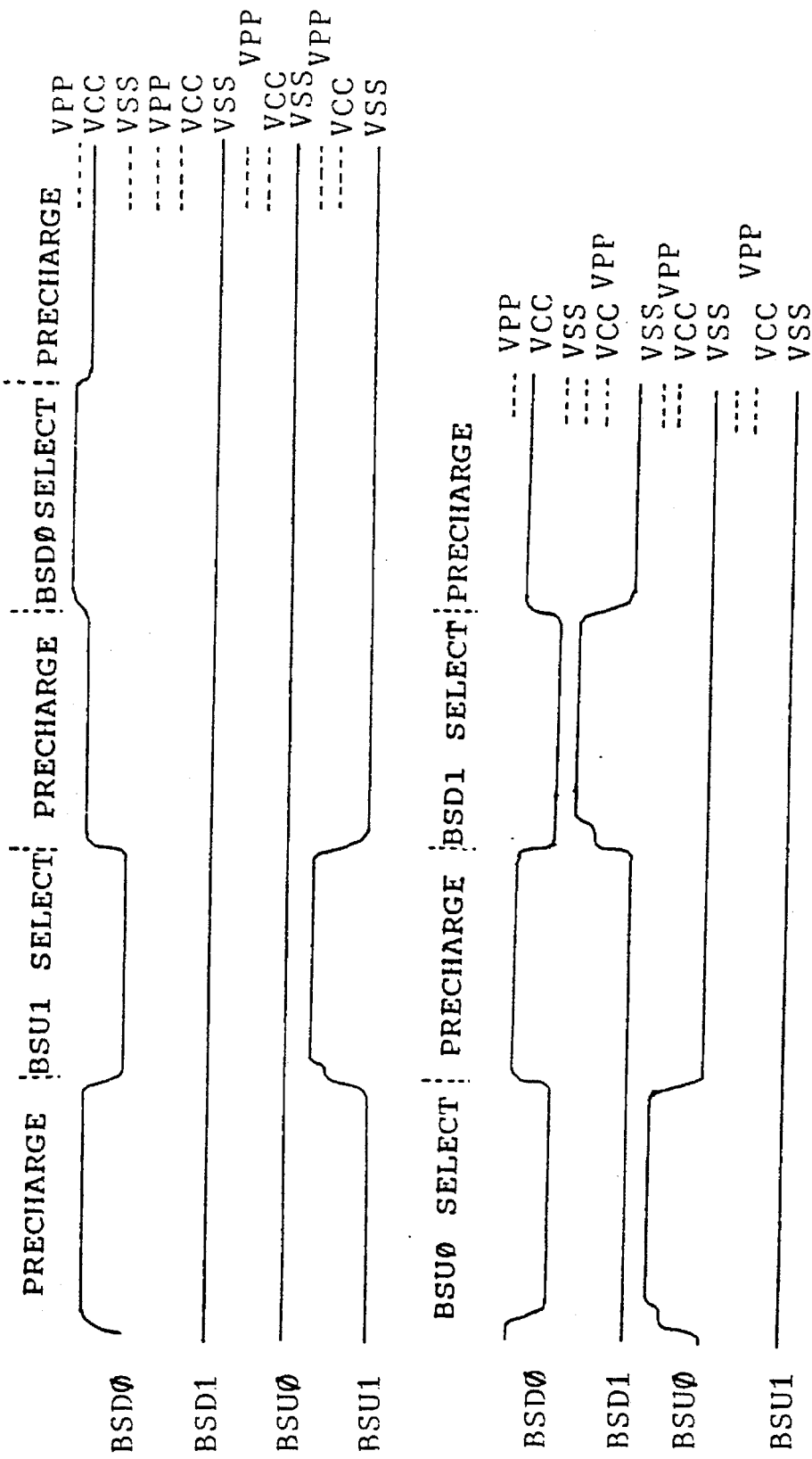
FIGS. 11 and 12 illustrate wave patterns for another embodiment according to the present invention; and Tables 1 to 3 illustrate the operations of the bit/line selection signal generating circuits.

FIG. 11 illustrates still another example of the present invention. In this case, there is used a double shared sense amplifier in which four bit line pairs are connected to one single sense amplifier, and the bit lines of the DRAM is driven with the double shared sense amplifier. Under this condition, four signals BSU0, BSU1, BSD0 and BSD1 are required for selecting the bit lines.

Figure 3:
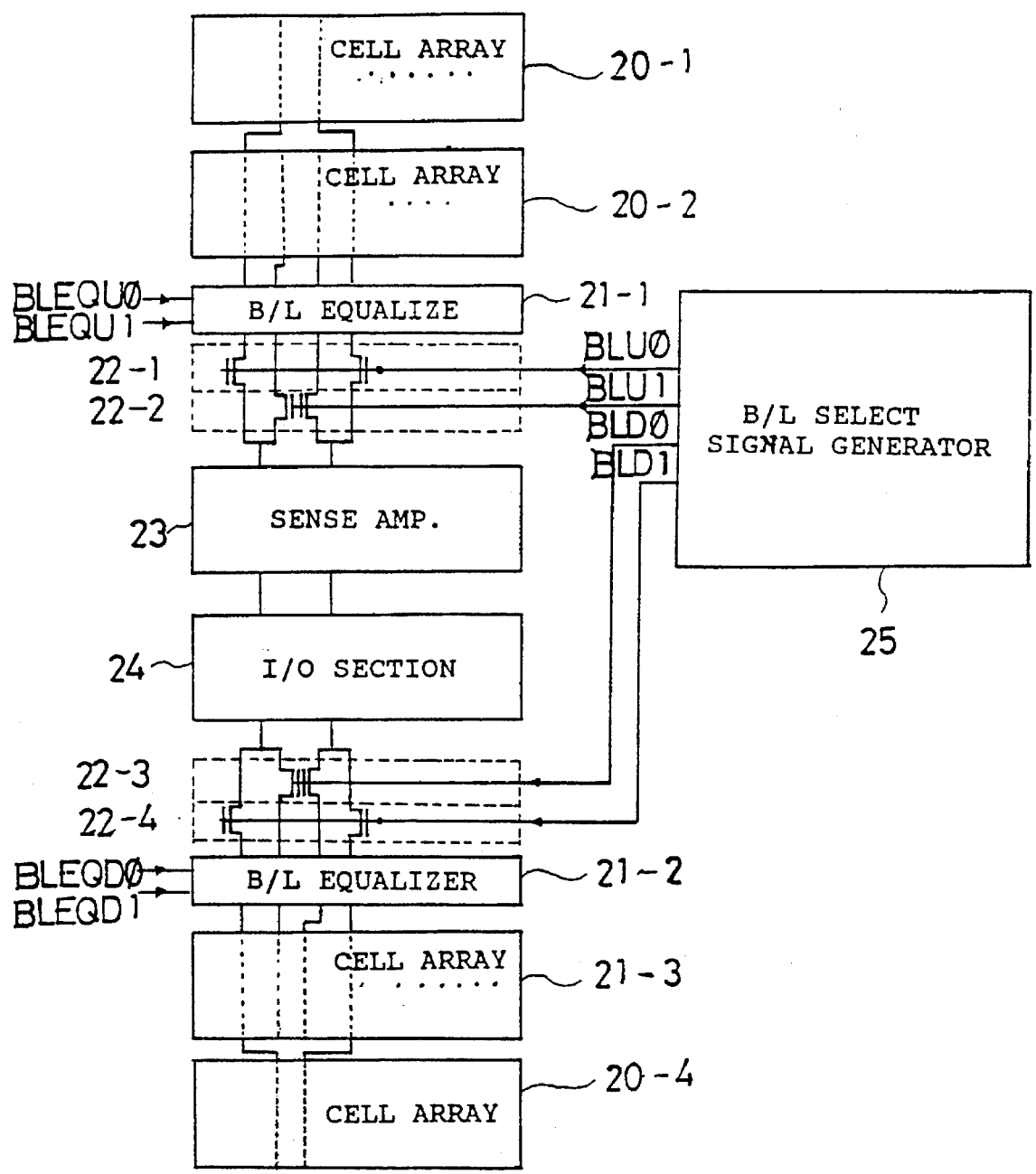
FIG. 3 is a block diagram showing the constitution of the double shared sense amplifier in which four bit line pairs are connected to a single sense amplifier.
Figure 4:
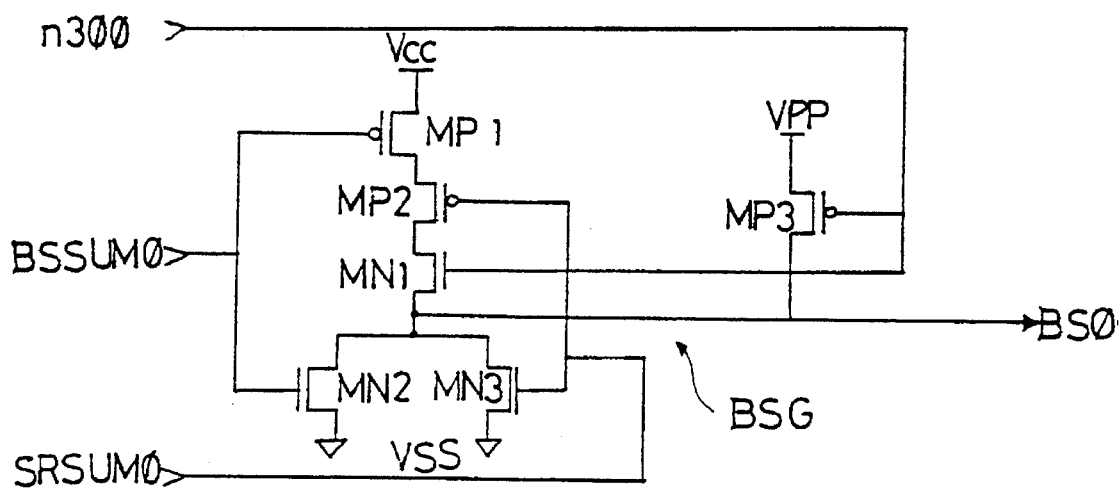
FIG. 4 illustrates the bit line selection signal generating section.
Figure 5:
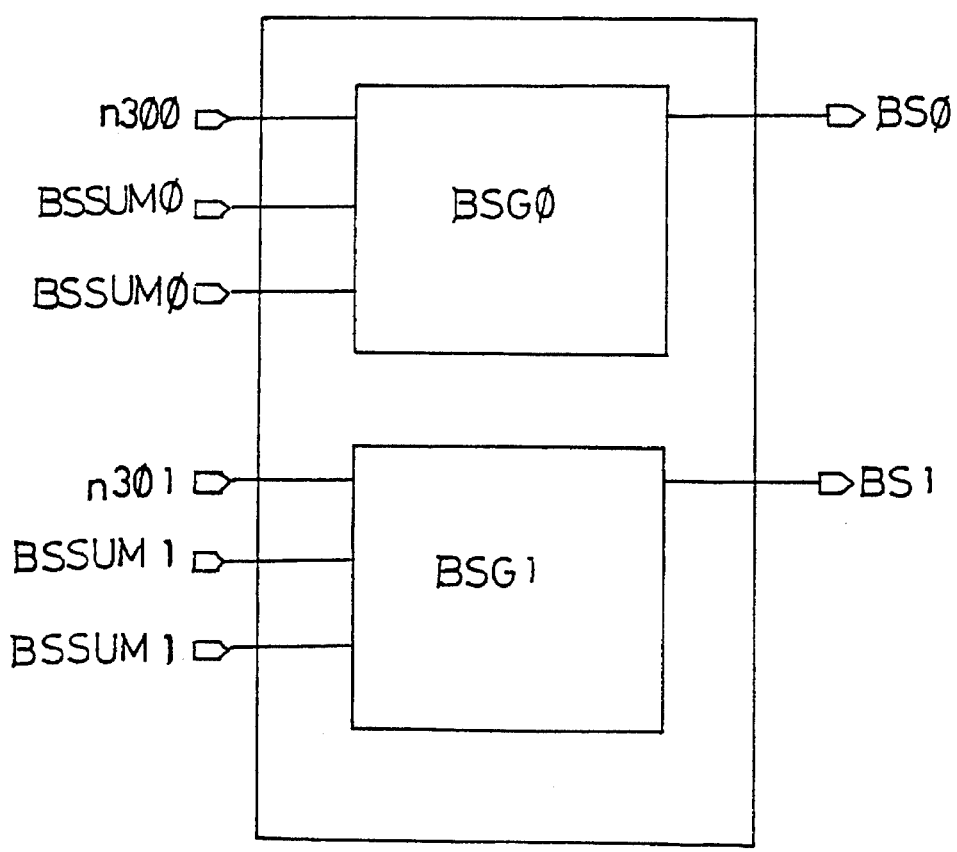
FIG. 5 is a circuital illustration of the bit line selection signal generating section.

This method is basically same as that of FIG. 8, and this method will be described by dividing it into the pre-charging and the bit line selection. First, during the pre-charging, only one predetermined signal (e.g., BSD0) is maintained at the Vcc level, while the rest of the signals are sifted to the Vss level. Then during the bit line selection, the selected signal is shifted to the Vpp level, while the rest of the signals (non-selected) are shifted to the Vss level. In carrying out this method, the circuit of FIG. 3 is used.

In this method, the sense amplifier is equalized by means of only one single signal among the four signals, and therefore, less power consumption is required compared with the conventional bit line selecting method.

Figure 12:
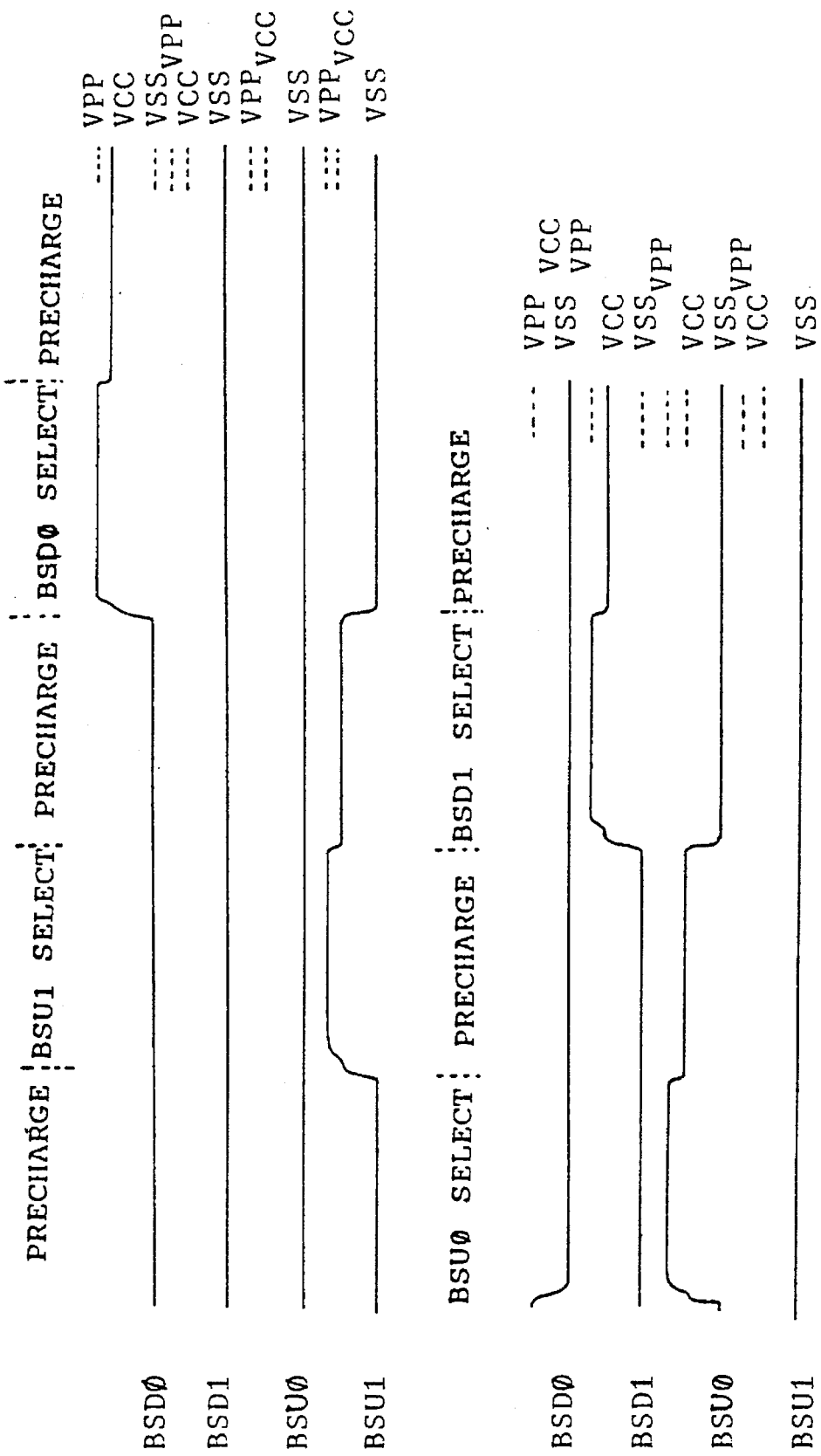

FIG. 12 illustrates a structure which is improved based on the above described method. In this case also, the bit line selecting signal which has been selected at the preceding state during the pre-charging is maintained at the Vcc level, while the rest of the signals are maintained at the Vss level. During the bit line selection, the selected signal is shifted to the Vpp level, while the rest of the signals non-selected are maintained at the Vss level.

The method of the present invention as described above may be said to be very effective in saving the power consumption compared with the conventional method in which all the bit line selecting signals are maintained at the Vcc level during the pre-charging, so that the signal transitions would occur during the bit line selection, thereby increasing the power consumption.

Particularly, during the self refresh operation in which a low power consumption is required, the word lines are activated in an orderly manner, and therefore, the same sense amplifier can be selected repeatedly. For this case, the present invention is very effective.

What is claimed is:

1. A method for driving bit line selecting signals in a DRAM having a plurality of memory cell arrays, bit lines connected to a plurality of memory cells included in said memory cell arrays, a bit line equalizer section for pre-charging said bit lines, a sense amplifier section connected to bit line pairs for reading cell data, a bit line selection signal generating section for generating bit line selecting signals, a bit line selecting section for connecting the pairs of said bit lines to said sense amplifier section, and a data input/output section, said method characterized in that:

during a bit line selection, a bit line selecting signal for connecting one pair of said bit lines among the n pairs of said bit lines to the sense amplifier is made to have a voltage (Vpp) level capable of connecting said bit line to said sense amplifier by the help of said bit line selecting section without a voltage loss; and the other bit line selecting signals corresponding to the non-selected remaining bit lines are made to have a voltage (Vss) incapable of connecting the bit lines to the sense amplifier by said bit line selecting section; and thereafter, during the pre-charging for a bit line equalization, the bit line selecting signal corresponding to the bit line which was selected just before is given a voltage (Vcc) capable of connecting the bit line to the sense amplifier by the help of said bit line selecting section; and the bit line selecting signals which do not correspond to the bit line selected just before are maintained without a voltage shifting.

2. The method as claimed in claim 1, wherein the n pairs of bit lines connected to said sense amplifier are two pairs of bit lines.

3. The method as claimed in claim 1, wherein the n pairs of bit lines are four pairs of bit lines.

4. A bit line selection signal generating circuit for connecting bit lines to a sense amplifier, comprising:

a serial circuit consisting of two NMOSFETs MN10 and MN11 and one PMOSFET MP10 connected between a Vcc terminal and a Vss terminal;

a PMOS transistor MP11 connected to a power source Vpp and connected to an output node OP which is the connection point between said NMOSFET MN10 and said NMOSFET MN11;

said output node OP being connected through an invertor IV1 to an input node IP;

said input node IP being connected through an invertor IV2 to an input terminal of a NAND gate;

the gates of said PMOSFET MP10 and said NMOSFET MN11 being connected to said input node IP;

said input node IP being connected through a transmission gate TG to a signal BSSUM0, another signal SRSUM0 being connected to a control input terminal of said transmission gate TG, and a signal n300 being connected to another input terminal said NAND gate; and the output terminal of said NAND gate being connected to a level shifting circuit 32 for shifting a Vcc level to a Vpp level, and the output terminal of said level shifting circuit 32 being connected to the gates of said transistors MP11 and MN10.

5. A bit line selection signal generating circuit for connecting pairs of bit lines to a sense amplifier, comprising:

a bit line selection signal generating circuit BSG for generating bit line selecting signals;

a flip-flop connected to the output terminal of said circuit BSG for utilizing the previously selected bit lines during the next pre-charging;

a NAND gate connected to signals BRSUM0, BSSUM0 and n300 for sending control signals to said flip-flop and to two transistors connected to a bit line selection signal output line; and two transistors for connecting said bit line selecting signals to an output node OP in accordance with the control signals of said NAND gate.

6. The bit line selection signal generating circuit as claimed in claim 5, wherein:

said NAND gate has three input terminals, two of them being respectively connected through invertors IN3 and IN4 to said signals BRSUM0 and BSSUM0, and the remaining one being connected to said signal n300;

the output of said NAND gate is supplied to a terminal CK as a control signal for said flip-flop, and the output terminal of said NAND gate also is connected through an invertor IN5 to the gate of a transistor MN13; and the output of said circuit BSG is connected to an input terminal D of said flip-flop FF, and the output terminal Q of said flip-flop FF is connected through said NMOS transistor MN13 to said output terminal OP;

whereby, during a pre-charging, the output of said circuit BSG for maintaining all the signals at the Vcc level is supplied through said NMOS transistor MN14 to its output terminal so as to become a signal BS0, and the gate of said transistor MN14 is connected to the output terminal of a NAND3 gate.

* * * * *